United States Patent
Tsai

(10) Patent No.: US 8,578,199 B2
(45) Date of Patent: Nov. 5, 2013

(54) RESETTING REAL TIME CLOCK UPON REFERENCE CLOCK INTERRUPTION

(75) Inventor: Jia-Shian Tsai, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 482 days.

(21) Appl. No.: 12/853,312

(22) Filed: Aug. 10, 2010

(65) Prior Publication Data

US 2011/0320852 A1    Dec. 29, 2011

(30) Foreign Application Priority Data

Jun. 23, 2010   (TW) ................................ 99120461 A

(51) Int. Cl.
*G06F 1/14* (2006.01)
(52) U.S. Cl.
USPC .......................................... 713/500; 713/503
(58) Field of Classification Search
None
See application file for complete search history.

(56) References Cited

U.S. PATENT DOCUMENTS

| | | | |
|---|---|---|---|
| 4,230,958 A * | 10/1980 | Boll et al. ....................... | 327/18 |
| 5,917,350 A | 6/1999 | Graf, III | |
| 6,597,204 B2 * | 7/2003 | Imamura ......................... | 327/20 |
| 6,668,334 B1 * | 12/2003 | Abel et al. ..................... | 713/500 |
| 2007/0188904 A1 * | 8/2007 | Tsuyama ........................ | 360/51 |

FOREIGN PATENT DOCUMENTS

| | | | |
|---|---|---|---|
| CN | 1255691 | | 6/2000 |
| JP | 1993-160823 | * | 6/1993 |
| JP | 1997-55769 | * | 2/1997 |
| JP | 2001-196851 | * | 7/2001 |
| JP | 2003075479 | | 3/2003 |
| TW | 200908563 | | 2/2009 |
| TW | 200940962 | | 10/2009 |

OTHER PUBLICATIONS

"Office Action of Taiwan counterpart application" issued on Jul. 26, 2013, p1-p6, in which the listed references were cited.
"Office Action of Taiwan counterpart application" issued on Jul. 26, 2013, p1-p6, in which the listed references (Ref. 2-3) were cited.
"First Office Action of China counterpart application" issued on Jul. 30, 2013, p1-p7, in which the listed references (Ref. 1 and 4-5) were cited.

* cited by examiner

*Primary Examiner* — Kenneth Kim
(74) *Attorney, Agent, or Firm* — Jianq Chyun IP Office

(57) ABSTRACT

A clock circuit is suitable for use in a timing circuit which provides time information according to a reference clock. The clock circuit includes a clock detector to detect whether or not an interruption of the reference clock occurs. When the interruption of the reference clock occurs, a clock interruption signal is issued as a reference whether or not to reset the timing circuit.

1 Claim, 4 Drawing Sheets

RESETTING REAL TIME CLOCK UPON REFERENCE CLOCK INTERRUPTION

CROSS-REFERENCE TO RELATED APPLICATION

This application claims the priority benefit of Taiwan application serial no. 99120461, filed on Jun. 23, 2010. The entirety of the above-mentioned patent application is hereby incorporated by reference herein and made a part of this specification.

BACKGROUND OF THE INVENTION

1. Field of Invention

The present invention relates to reset circuit of clock circuit to efficiently cause a reset on the real time circuit.

2. Description of Related Art

Real time clock (RTC) has broad applications, such as applications in various electronic circuits with time information. The time information can be used to record the time for each event occurred. Therefore, the real time clock is a timing reference information.

Usually, the operation of the RTC is using the static capacitor for storing charges. When the battery is detached, the action time for the RTC would be different with respect to the status of the electric consumption of the RTC. The action time is then affected by the static capacitance level and IC fabrication process. In this situation, when the charges are completely consumed, the RTC stop accordingly. When the battery is attached again, the RTC needs a rest signal to reset the whole circuit, and makes a warning about invalidity and the time need to be reset. However, the duration of the reset signal and the activation time of the RTC are both affected by the supplied voltage, difference of circuit, device and so on.

In other words, how to assure the effective rest of the RTC is one of the issues.

SUMMARY OF THE INVENTION

The invention provides a time reset circuit and time rest method to at least assure that the reset for the RTC is effectively made.

In an embodiment, the invention provides a clock circuit used for a timing circuit. The timing circuit provides a timing information according to a reference clock. The clock circuit includes a clock detector to detect whether or not an interruption of the reference clock occurs. When the interruption of the reference clock occurs, a clock-interruption signal is issued as a reference whether or not to reset the timing circuit.

As an embodiment, in the foregoing clock circuit, an operation power is provided to the clock detector from a bias unit. The clock detector includes, for example, a capacitor, a switching device, and a comparator. The capacitor is coupled between the bias unit and a ground voltage, wherein a connection terminal of the capacitor and the bias unit outputs a detected voltage. The switching device is coupled between the bias unit and a ground voltage and is coupled with the capacitor in parallel. The switching unit is conducted when at a clock edge region of the reference clock. The switching unit is open when not at the clock edge region of the reference clock. The comparator receives the detected voltage and the reference voltage. When the detected voltage is greater than the reference voltage, the reset signal is issued.

The invention also provides a time reset method used to reset a timing circuit. The method includes receiving a reference clock of the timing circuit and detecting whether or not an interruption of the reference clock occurs. When the reference clock is interrupted, a clock interruption is issued as a reference whether or not the resting the timing circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The rest mechanism for the time, as proposed by the invention, can provide a reliable reset signal without affecting by environment, and can effectively provide the reset signal for the RTC. The circuit can efficiently use the electric power, so as to continuously detect the oscillating crystal, which produces the reference clock. The reset circuit can be correctly operated until the clock returns back to normal operation.

Embodiments are provided for describing the invention. However, the invention is not just limited to the embodiments. In addition, the embodiments may also be properly combined to each other.

The RTC is to provide the system with the real time, which is useful to realize the operation status with respect to a system time. Therefore, the RTC circuit is a basic circuit and needs to match to the real time. If the time produced by the RTC is not correct, it would cause the occurring time for each event of the system to be error, for example.

Figure 1:
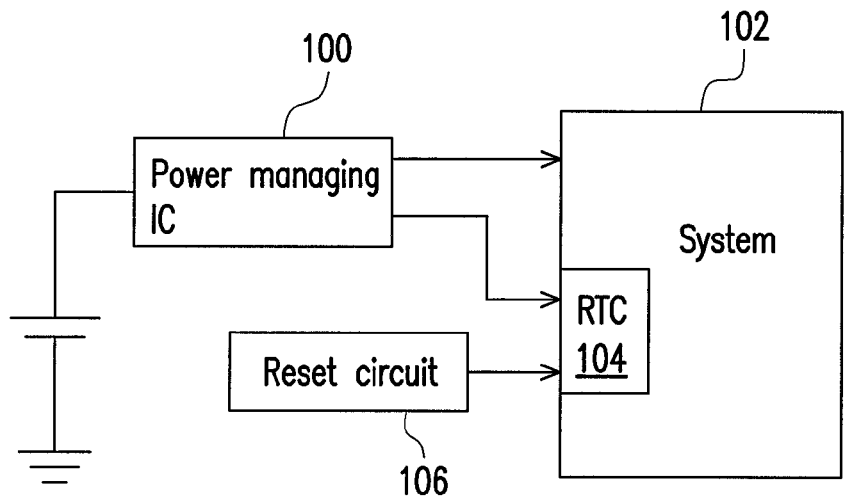
FIG. 1 is a circuit block diagram, schematically illustrating a system having a RTC, according to an embodiment of the invention.

FIG. 1 is a circuit block diagram, schematically illustrating a system having a RTC, according to an embodiment of the invention. In FIG. 1, the battery provides the electric power to the system 102 via the power managing IC 100, and also provides the electric power to the RTC 104. When the batter is detached, the reset circuit 106 is activated to issue a reset signal to the RTC 104.

Figure 2:
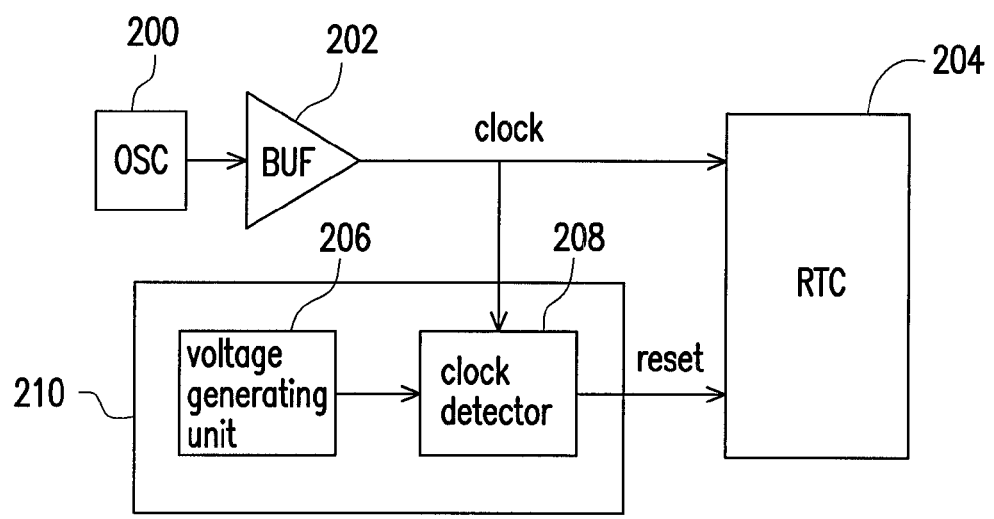
FIG. 2 is a circuit block diagram, schematically illustrating a clock circuit with the rest circuit, according to an embodiment of the invention.

FIG. 2 is a circuit block diagram, schematically illustrating a clock circuit with the rest circuit, according to an embodiment of the invention. In FIG. 2 the clock circuit can include a timing circuit 204 and a clock detector 208. The timing circuit 204, such as a RTC circuit, can provide the real time information for use in the external system, according to the reference clock. The reference clock can be produced by an oscillating signal provided by an oscillating crystal circuit (OSC) 200, for example, and then is delayed by the buffer (BUF) 202. The reference clock is at high frequency level, and is received by the timing circuit 204 for converting into time information.

Usually, before the static charges of capacitor are completely consumed, that is, before the voltage drops to zero, the OSC 200 has already stop. This is because the OSC 200 needs to be operated at an operation voltage.

The clock detector 208 is implemented in the reset circuit 210 and is powered by the voltage generating unit 206. In addition, the clock detector 208 also receives the reference clock to detect whether or not the reference clock is interrupted. When the interruption of the reference clock occurs, a clock interruption signal is issued, such as a high-level voltage to serve as the reset signal to the timing circuit 204. When the reference clock returns back to the normal operation, the clock interruption signal is changed to low-level voltage, for example, and the timing circuit 204 is not reset. The activation of the clock interruption signal at high-level voltage or low-level voltage is determined by the system requirement, and is not limited to the high-level voltage for activation.

Figure 3:
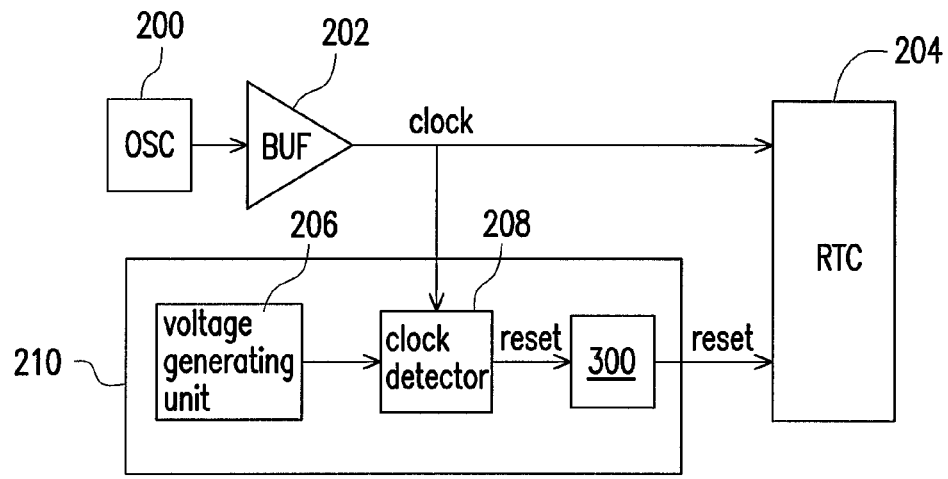
FIG. 3 is a circuit block diagram, schematically illustrating another clock circuit with the rest circuit, according to an embodiment of the invention.

FIG. 3 is a circuit block diagram, schematically illustrating another clock circuit with the rest circuit, according to an embodiment of the invention. In FIG. 3, the circuit and the operation mechanism is similar to FIG. 2. However, the issued rest signal can be temporarily stored in a storage device 300, such as register. The value of the rest signal in the storage device 300 can be read by software or hardware and then an action on the timing circuit 204 can be determined, such as determining whether or not resetting the timing circuit 204.

Figure 4:
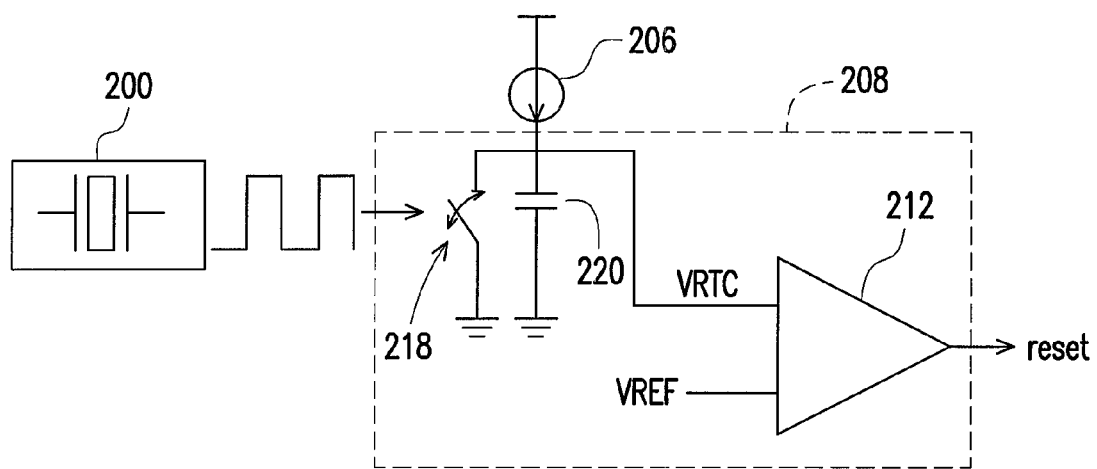
FIG. 4 is a circuit block diagram, schematically illustrating a clock detector, according to an embodiment of the invention.

In order to achieve the foregoing function of the clock detector 208, and an embodiment is provided for description. FIG. 4 is a circuit block diagram, schematically illustrating a clock detector, according to an embodiment of the invention. In FIG. 4, the voltage generating unit 206 is providing power to the clock detector 208 by the manner of current source. The clock detector 208 receives the clock in the form of pulses. The clock detector 208 is powered by the voltage generating circuit 206, wherein clock detector 208 includes a capacitor 220, a switching device 218 and a comparator 212. The capacitor 220 is coupled between the voltage generating circuit 206 and a ground voltage. The connection terminal between the capacitor 220 and the voltage generating circuit 206 outputs a detected voltage, indicated as VRTC. The switching device 218 is coupled between the voltage generating circuit 206 and the ground voltage, and is coupled with the capacitor 220 in parallel. The switching device 218 is controlled by the control of clock. The switching device is conducted when at a clock edge region of the reference clock. The switching device is open when not at the clock edge region of the reference clock. The comparator 212 receives the detected voltage (VRTC) and a reference voltage. The reference voltage is indicated as VREF. When the detected voltage (VRTC) is greater than the reference voltage (VREF), the reset signal is issued.

Figure 5:
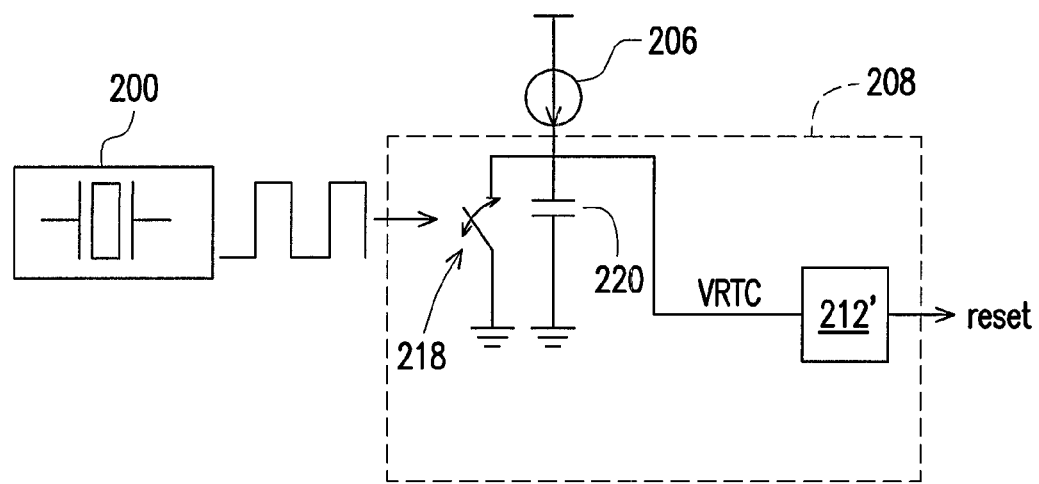
FIG. 5 is a circuit block diagram, schematically illustrating another clock detector, according to an embodiment of the invention.

FIG. 5 is a circuit block diagram, schematically illustrating another clock detector, according to an embodiment of the invention. In FIG. 5, the circuit and the operation mechanism is similar to FIG. 4. However, it can be done by a trigger circuit 212'. The trigger circuit 212' is schmitt trigger, for example. When the detected voltage is over the trigger voltage set in the schmitt trigger, a clock interruption signal is issued to serve as the reset signal of the timing circuit.

How to detect edge of the clock and how to control the switching device 218 can be achieved by the usual manner without specific option. However, clock detector 208 is to have the function to detect the clock under the mechanism described in FIG. 7.

Figure 6:
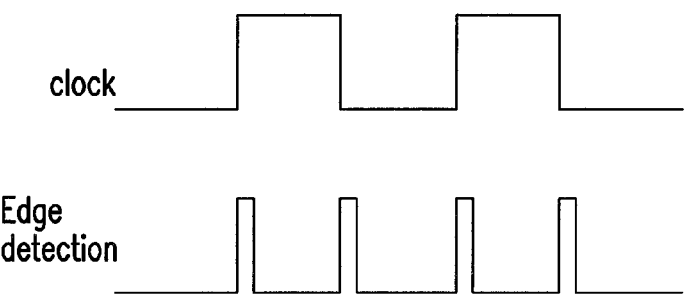
FIG. 6 is a drawing, schematically illustrating the characteristics at the clock edge region, according to an embodiment of the invention.

The property of the clock edge region is first described. FIG. 6 is a drawing, schematically illustrating the characteristics at the clock edge region, according to an embodiment of the invention. In FIG. 6, the clock is in a form of pulses. The pulse has rising edge and falling edge. The edge detecting signal has short pulse at the edge regions, and can be used to control the switching device to be conducted or open. The width of the short pulse is set depending on the actual need. Whether or not the clock is interrupted cam be known from the edge detecting signal.

Figure 7:
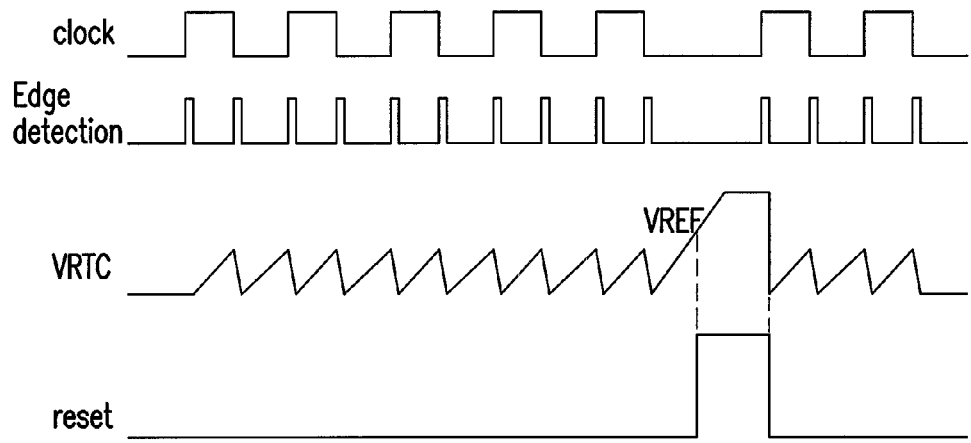
FIG. 7 is a drawing, schematically illustrating the clock detecting mechanism, according to an embodiment of the invention.

FIG. 7 is a drawing, schematically illustrating the clock detecting mechanism, according to an embodiment of the invention. Referring to FIG. 7 and FIG. 4, if clock is under operation, the edge detecting signal has short pulses according to the frequency. The short pulses conduct the switching devices 218, and cause a discharge on the capacitor 220. At the region other than the edge region, the edge detecting signal opens the switching device 218, causing a charging on the capacitor 220. Since the pulse width is rather short, the charging period on the capacitor is also short. The voltage of VRTC has already been pulled down to the ground voltage due to discharge before the voltage of VRTC is over the reference voltage VREF.

When an interruption occurs on the clock, the edge does not occur in a short time period. Therefore, the capacitor is continuously charges or even charge to the saturation voltage. In this manner, when the VRTC of the capacitor 220 is greater than the reference voltage VREF, it can be judged that an interruption of clock occurs. Then, a reset signal is issued. When the clock returns back to the normal operation, the clock edge occurs again, and causes discharge on the capacitor 220 and stops issuing the reset signal.

In other words, the circuit detects the clock of the clock generating circuit. When the clock is not at the normal operation, the reset signal is issued and remains. The reset signal is off until the clock appears again. However, if the clock disappears again in this period, the reset signal is again issued until the clock appears again. In this manner, the circuit is surely operated at the status having the normal clock. The circuit is indeed also reset. It will not occur that the clock has returned but the reset signal does not correctly change to the status; or the reset signal has been stop but the clock is still not at the normal operation.

Figure 8:
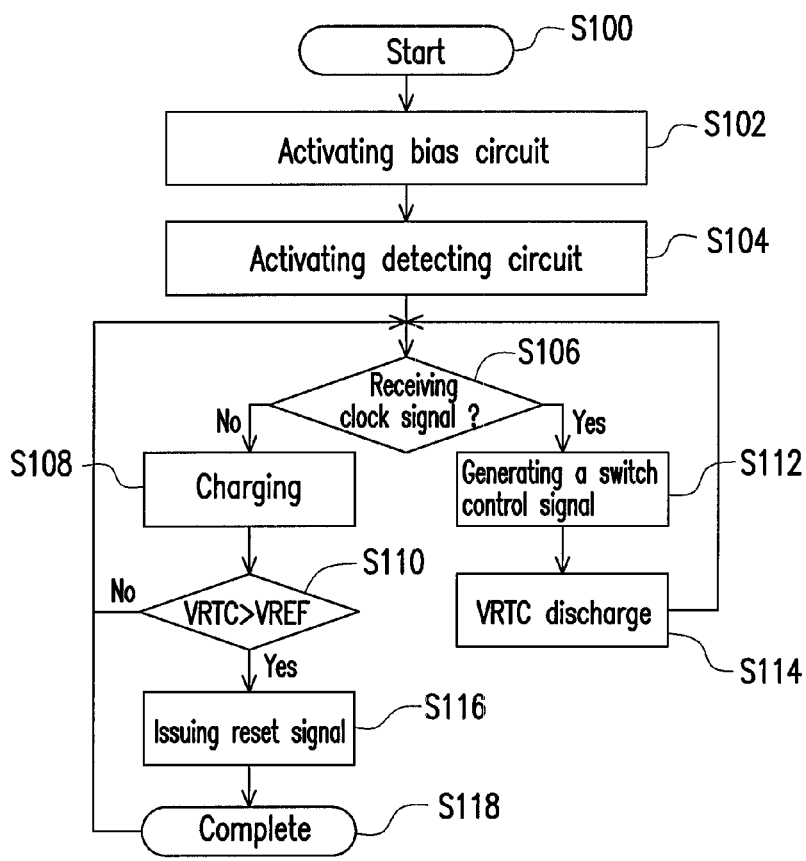
FIG. 8 is a drawing, schematically illustrating the process flow for resetting the time, according to an embodiment of the invention.

With respect to operation method, it can be shown by the process flow. FIG. 8 is a drawing, schematically illustrating the process flow for resetting the time, according to an embodiment of the invention. Referring to FIG. 8, the reset flow start at step S100. In step S102, the bias circuit is activated to provide the electric power in need. In step S104, the detecting circuit is activated and the status of the clock is detected. In step S106, it is determined whether or not the clock signal is received. In step S108, if the clock signal is not received, the capacitor is charged. In step S110, during charging the capacitor, the VRTC is compared with VREF. If VRTC is greater than VREF, then the process goes to step S116. If the VRTC is not greater than VREF, the process returns to step S106. Continuing to step S108, in step S112, if the clock signal is received, a switch control signal is generated to conduct the switching device. In step S114, the capacitor is discharged because the switching device is conducted. In step S116, the reset signal is issued. In step S118, the current rest process completes and the process returns back to the step S106 to continuously detect the clock.

The invention proposes the time resting mechanism, capable of providing a reliable mechanism to detect the clock and effectively providing the RTC reset signal. The time resting mechanism can efficiently use the power to continuously detect the OSC, which produces the reference clock. By the detecting circuit, the reset signal can be surely and correctly issued until the clock returns back to the normal condition.

The invention can assure clock under operation until the limit of operation range is reached without being affected by the voltage level. This is because the circuit is detecting the clock. Under the condition with the valid clock, the circuit can still be normally operated with additional processing. The convention circuit needs to detect the voltage and set a threshold value, so as to stop the circuit and avoid abnormal operation. Under the capacitance, the circuit of the invention can operated for a longer period.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A clock circuit, consisting of:
   an oscillating crystal circuit, providing an a reference clock;
   a buffer, coupled to the oscillating crystal circuit, delaying the reference clock;
   a timing circuit, coupled to the buffer, and converting the reference clock into time information;
   a bias unit;
   a clock detector, coupled to the bias unit and the buffer, configured to detect whether or not an interruption of the reference clock occurs, wherein when the interruption of the reference clock occurs, a clock interruption signal is issued as a reference whether or not to reset the timing circuit; and
   a storage device, coupled between the timing circuit and the clock detector, storing the clock interruption signal;
   wherein the clock detector is powered by the bias unit, and the clock detector consists of:
   a capacitor, coupled between the bias unit and a ground voltage, wherein a connection terminal of the capacitor and the bias unit outputs a detected voltage;
   a clock edge detector, detecting the reference clock and determining whether or not at a clock edge region;
   a switching device, coupled between the bias unit and the ground voltage and coupled with the capacitor in parallel, wherein the switching unit is conducted and the capacitor is discharged via the switching device when at the clock edge region of the reference clock, wherein the switching unit is open and the capacitor is charged due to the switching device when not at the clock edge region of the reference clock; and
   a first circuit, receiving the detected voltage, wherein the first circuit is a comparator or a trigger circuit, and when the detected voltage is greater than a reference voltage or a trigger voltage, the clock interruption signal is issued to serve as a reset signal of the timing circuit.

* * * * *